(12) United States Patent
Cheng et al.

(10) Patent No.: US 11,337,308 B2
(45) Date of Patent: May 17, 2022

(54) DISPLAY PANEL AND DISPLAY APPARATUS

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Chunghao Cheng, Beijing (CN); Kun Guo, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 351 days.

(21) Appl. No.: 16/482,611

(22) PCT Filed: Dec. 25, 2018

(86) PCT No.: PCT/CN2018/123458
§ 371 (c)(1),
(2) Date: Jul. 31, 2019

(87) PCT Pub. No.: WO2020/006999
PCT Pub. Date: Jan. 9, 2020

(65) Prior Publication Data
US 2021/0337672 A1   Oct. 28, 2021

(30) Foreign Application Priority Data
Jul. 2, 2018   (CN) .......................... 201810710257.4

(51) Int. Cl.
*H05K 1/02* (2006.01)
*H05K 1/11* (2006.01)
(Continued)

(52) U.S. Cl.
CPC ............. *H05K 1/189* (2013.01); *H05K 1/147* (2013.01); *H05K 2201/09036* (2013.01);
(Continued)

(58) Field of Classification Search
CPC ... H05K 1/02; H05K 1/11; H05K 1/14; H05K 1/142; H05K 1/144; H05K 1/117;
(Continued)

(56) References Cited

U.S. PATENT DOCUMENTS

| 10,371,995 B2* | 8/2019 | Li ....................... H01R 12/7076 |
| 2005/0153599 A1* | 7/2005 | Wu ........................ H05K 3/361 |
| | | 439/591 |

(Continued)

FOREIGN PATENT DOCUMENTS

| CN | 202443963 U | 9/2012 |
| CN | 104698689 A | 6/2015 |

OTHER PUBLICATIONS

International Search Report in Application No. PCT/CN2018/123458, dated Apr. 1, 2019.
(Continued)

*Primary Examiner* — Xiaoliang Chen
(74) *Attorney, Agent, or Firm* — Syncoda LLC; Feng Ma

(57) ABSTRACT

A display panel and a display apparatus containing the display panel are disclosed. The display panel includes a substrate, a circuit structure, and a first bonding adhesive. The substrate has a first bonding area. The circuit structure has a second bonding area that opposingly faces the first bonding area. The first bonding adhesive is arranged between, and configured to contact the first bonding area and the second bonding area. At least one of the first bonding area or the second bonding area comprises at least one first indentation. The first bonding adhesive at least partially fills one or more of the at least one first indentation.

18 Claims, 9 Drawing Sheets

(51) Int. Cl.
- *H05K 1/14* (2006.01)
- *H05K 3/00* (2006.01)
- *H05K 7/06* (2006.01)
- *G02F 1/133* (2006.01)
- *G02F 1/1335* (2006.01)
- *G02F 1/1345* (2006.01)
- *H05K 1/18* (2006.01)

(52) U.S. Cl.
CPC .............. *H05K 2201/09072* (2013.01); *H05K 2201/10128* (2013.01); *H05K 2201/10136* (2013.01); *H05K 2201/2009* (2013.01); *H05K 2201/2072* (2013.01)

(58) Field of Classification Search
CPC .......... H05K 3/00; H05K 3/323; H05K 3/361; H05K 7/06; G02F 1/133; G02F 1/1335; G02F 1/1345; G02F 1/13452
USPC ............ 361/760, 749, 803; 257/88, 91, 506; 349/62, 591; 174/254
See application file for complete search history.

(56) References Cited

U.S. PATENT DOCUMENTS

| | | | |
|---|---|---|---|
| 2011/0260180 A1* | 10/2011 | Kuranaga | G02F 1/133351 257/88 |
| 2012/0236230 A1* | 9/2012 | Nakahama | H01L 24/13 349/62 |
| 2012/0306047 A1* | 12/2012 | Liao | G02F 1/13452 257/506 |
| 2013/0342476 A1* | 12/2013 | Lee | G06F 3/041 345/173 |
| 2014/0029219 A1* | 1/2014 | Oh | G02F 1/13452 361/760 |
| 2014/0029230 A1* | 1/2014 | Oh | G02F 1/13452 361/803 |
| 2014/0254111 A1* | 9/2014 | Yamazaki | H01L 27/3262 361/749 |
| 2014/0319554 A1* | 10/2014 | Lee | H01L 24/83 257/91 |
| 2014/0332257 A1* | 11/2014 | Jee | H05K 3/323 174/254 |
| 2016/0278210 A1* | 9/2016 | Tsuruoka | H05K 1/117 |
| 2018/0288872 A1* | 10/2018 | Yonezawa | G02F 1/13458 |
| 2019/0121190 A1* | 4/2019 | Li | H01R 12/771 |
| 2019/0384080 A1* | 12/2019 | Jing | G02F 1/133514 |
| 2020/0068724 A1* | 2/2020 | Kishimoto | B60R 16/023 |
| 2021/0208644 A1* | 7/2021 | Wang | H01L 25/18 |

OTHER PUBLICATIONS

CN First Office Action in Application No. 201810710257.4, dated Dec. 25, 2019.

* cited by examiner

DISPLAY PANEL AND DISPLAY APPARATUS

CROSS-REFERENCE TO RELATED APPLICATION

The present application claims priority to Chinese Patent Application No. 201810710257.4 filed on Jul. 2, 2018, the disclosure of which is hereby incorporated by reference in its entirety.

TECHNICAL FIELD

The present disclosure relates generally to a field of display technologies, and specifically to a display panel and its manufacturing method, and a display apparatus.

BACKGROUND

In the manufacturing process of a display panel, the step of bonding a flexible printed circuit board (PCB) to a cladding film layer or the step of bonding a flexible printed circuit board (PCB) to a backplane are crucial. The quality of the above bonding step can directly influence the display function and the quality of the display panels.

In order to increase the bonding strength of a bonding zone, in addition to the use of an anisotropic conductive film (ACF) or an anisotropic conductive adhesive in the bonding zone to bond the flexible printed circuit board and the backplane (or to bond the flexible printed circuit board with the cladding film layer), a glue or adhesive is also commonly coated to increase the bonding strength in the bonding zone.

SUMMARY

In a first aspect, the present disclosure provides a display panel.

The display panel includes a substrate having a first bonding area, a circuit structure having a second bonding area facing the first bonding area, and further includes a first bonding adhesive between and contacting the first bonding area and the second bonding area. At least one of the first bonding area or the second bonding area comprises at least one first indentation. The first bonding adhesive at least partially fills one or more of the at least one first indentation.

According to some embodiments, the at least one first indentation is within the first bonding area on the circuit structure.

Herein, each of the at least one first indentation can optionally have a shape of a groove or a through-hole.

According to certain embodiments, the first bonding adhesive consists of a first anisotropic conductive adhesive, which is configured to at least partially fill one or more of the at least one first indentation.

According to some other embodiments, the first bonding area comprises a first bonding and conduction region, and the second bonding area comprises a second bonding and conduction region, opposingly facing the first bonding and conduction region. The first bonding adhesive comprises a first anisotropic conductive adhesive and another adhesive. The first anisotropic conductive adhesive, is arranged in a space between the first bonding and conduction region and the second bonding and conduction region, and is configured to electrically connect electrical components in the first bonding and conduction region in the substrate and electrical components in the second bonding and conduction region in the circuit structure. The another adhesive is arranged in another space between the first bonding area and the second bonding area other than the space between the first bonding and conduction region and the second bonding and conduction region. It is configured such that at least one of the first bonding adhesive or the another adhesive at least partially fills the at least one first indentation.

Furthermore, the another adhesive can optionally have a composition of a non-conductive thermosetting adhesive, which is configured to at least partially fill the at least one first indentation.

In some embodiments of the display panel where the at least one first indentation is within the first bonding area on the circuit structure, one or more of the at least one first indentation are each a through-hole, and the display panel further comprises a first reinforcement plate on a surface of the circuit structure away from the substrate. The first reinforcement plate is configured to cover the through-hole to thereby prevent the first bonding adhesive from overflowing.

According to some embodiments of the display panel, one or more of the at least one first indentation is within the second bonding area on the substrate.

According to some other embodiments of the display panel, the at least one first indentation is both within the first bonding area on the circuit structure and within the second bonding area on the substrate.

In any one of the embodiments described above, where the second bonding area has a larger area than the first bonding area, the first bonding adhesive can optionally comprise a first side adhesive, which is arranged to cover a side surface of the substrate and a portion of the second bonding area of the circuit structure.

Herein, one or more of the at least one first indentation can optionally be outside an orthographic projection of the first bonding area on the second bonding area on the circuit structure, and the first side adhesive at least partially fills the one or more of the at least one first indentation.

In the display panel disclosed herein, the display panel can further include a circuit board having a third bonding area, and a second bonding adhesive. The circuit structure further comprises a fourth bonding area oppositely facing the third bonding area. The second bonding adhesive is between and contact the third bonding area and the fourth bonding area. At least one of the third bonding area or the fourth bonding area is provided with at least one second indentation, wherein the second bonding adhesive at least partially fills one or more of the at least one second indentation.

According to some embodiments, the at least one second indentation is within the fourth bonding area on the circuit structure.

Optionally, the second bonding adhesive can consist of a second anisotropic conductive adhesive, configured to at least partially fill one or more of the at least one second indentation.

Further optionally, each of the at least one second indentation can be a groove or a through-hole.

In some embodiments, one or more of the at least one second indentation are each a through-hole in the circuit structure, the display panel further comprises a second reinforcement plate on a surface of the circuit structure far away from the circuit board, configured to cover the through-hole to thereby prevent the second bonding adhesive from overflowing.

According to some embodiments, one or more of the at least one second indentation is within the third bonding area on the circuit board.

According to some other embodiments, the at least one second indentation is both within the third bonding area on the circuit board and within the fourth bonding area on the circuit structure.

In the display panel, the fourth bonding area can have a larger area than the third bonding area, and the second bonding adhesive can comprise a second side adhesive, which is arranged to cover a side surface of the circuit board and a portion of the fourth bonding area of the circuit structure.

According to some embodiments, one or more of the at least one second indentation is outside an orthographic projection of the third bonding area on the fourth bonding area on the circuit structure, and the second side adhesive at least partially fills the one or more of the at least one second indentation.

In a second aspect, the present disclosure further provides a display apparatus, which comprises a display panel according to any one of the embodiments as described above.

BRIEF DESCRIPTION OF DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of the embodiments disclosed herein, the technical solutions of the embodiments of the invention will be described in a clear and fully understandable way. It is noted that the described embodiments are merely a portion but not all of the embodiments of the invention. Based on the described embodiments of the invention, those ordinarily skilled in the art can obtain other embodiment(s), which come(s) within the scope sought for protection by the invention.

Unless otherwise defined, all terms used throughout the disclosure, including technical and scientific terms, have the same meaning as those commonly understood by people of ordinary skills in the field. It is further understood that terms such as those defined in dictionaries shall be interpreted as having meanings that are consistent with the context of the specification and with related technologies as well, and shall not be interpreted only in an ideal or formal manner unless otherwise explicitly defined herein.

Figure 1:
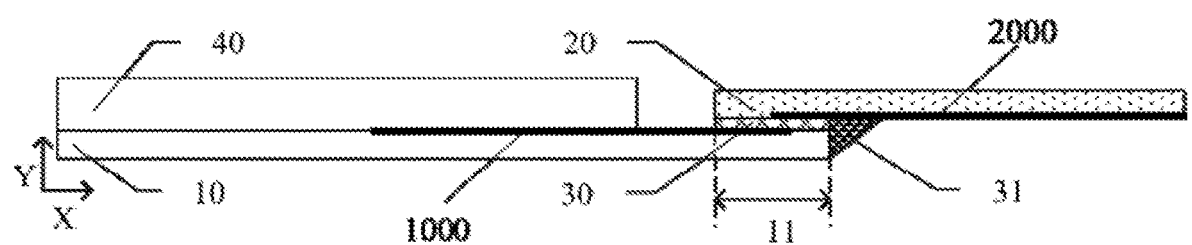
FIG. 1 is a structural diagram illustrating a local structure of a display panel according to an existing technology.

FIG. 1 is a structural diagram illustrating a local structure of a display panel according to a related technology. As shown in FIG. 1, the display panel includes a backplane (i.e. backplate) 10 and a flexible printed circuit board (or Chip on film (COF)) 20.

The backplane 10 includes a bonding area 11 such as is a peripheral or edge region of the backplane 10 as shown in FIG. 1. The flexible printed circuit board (or COF) 20 is bonded onto the bonding area 11 of the backplane 10 via an anisotropic conductive adhesive 30. The flexible printed circuit board 20 includes a plurality of first conductive electrodes 2000 on a side of the flexible printed circuit board 20 facing the backplane 10. The backplane 10 includes a plurality of second conductive electrodes 1000. The plurality of first conductive electrodes 1000 are electrically connected to the plurality of second conductive electrodes 2000 through the anisotropic conductive adhesive 30.

As such, the anisotropic conductive adhesive 30 not only plays a role of electrically conducting the backplane 10 and the flexible printed circuit board 20, but also plays a role of bonding the flexible printed circuit board 20 to the bonding area 11 of the backplane 10. In addition, in order to further enhance the bonding strength of the bonding area 11, a first side adhesive 31 is further coated on a side of the backboard 10. The backplane 10 also includes a cover glass 40, which is configured to protect components on the backplane 10.

Inventors of this present disclosure have discovered that in the display panel shown in FIG. 1, the bonding area 11 is a relatively weak part in terms of the structural strength. The bonding area 11 can be easily damaged by external forces during an improper assembling operation.

In a first aspect, the present disclosure provides a display panel.

The display panel includes a substrate and a circuit structure, bonded with each other via a first bonding adhesive. The substrate has a first bonding area, configured for applying the first bonding adhesive thereon to thereby allow the substrate to bond with the circuit structure. The circuit structure has a second bonding area oppositely facing the first bonding area on the substrate, configured for applying the first bonding adhesive thereon to thereby allow the circuit structure to bond with the substrate. Thus in the display panel, the first bonding area on the substrate and the second bonding area on the circuit structure are bonded with each other via the first bonding adhesive applied therebetween.

One or both of the first bonding area on the substrate and the second bonding area on the circuit structure are provided with at least one first indentation, and at least one portion of each of the at least one first indentation is filled with the first bonding adhesive to thereby enhance a strength of bonding between the circuit structure and the substrate. Herein and throughout the disclosure, the term "indentation" is referred to as a cavity-like structure on a surface, and can be interchanged with recess, hole, depression, pit, dent, hollow, or alike.

In the display panel disclosed herein, by filling the first bonding adhesive in the first indentation, the bonding strength between the circuit structure and the substrate can be increased.

Figure 2A:
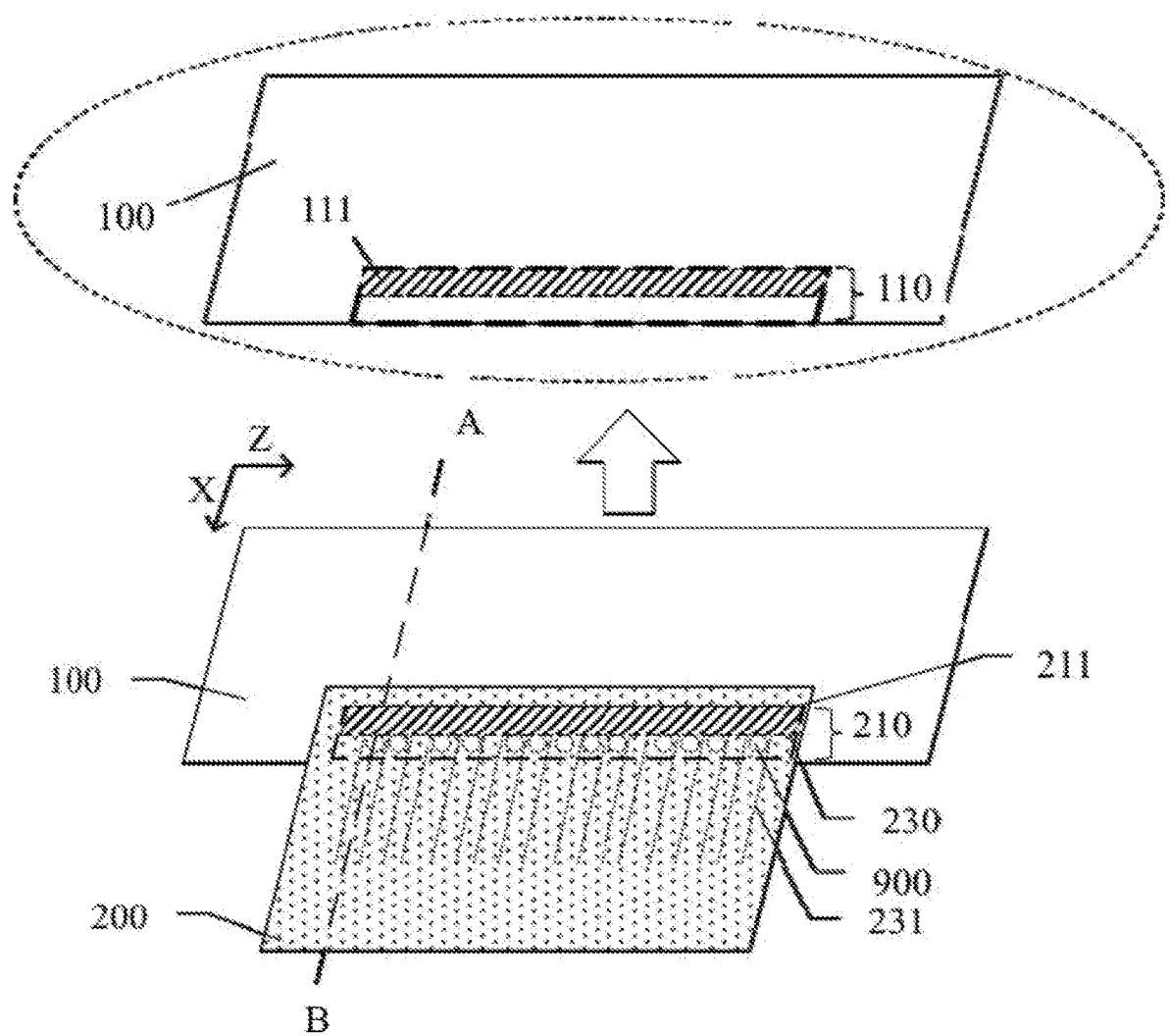
FIG. 2A shows a perspective view of a display panel according to some embodiment of the disclosure.
Figure 2B:
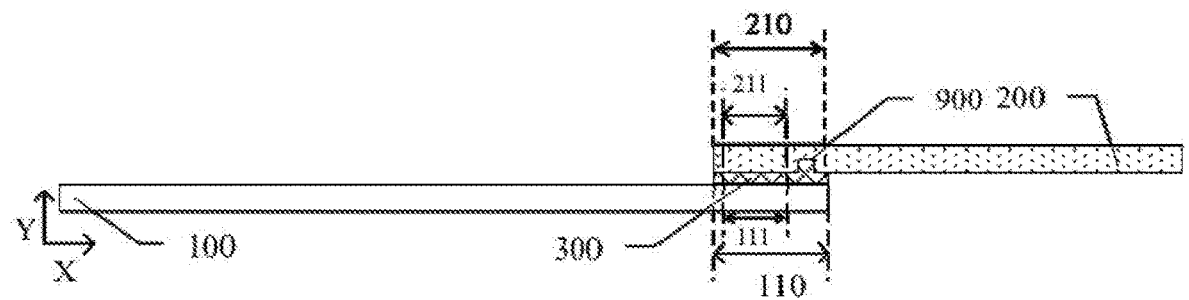
FIG. 2B shows a cross-section view of the display panel as shown in FIG. 2A along the line AB.

FIG. 2A is a structural diagram illustrating a local structure of a display panel according to some embodiments of the disclosure. FIG. 2B shows a cross-section view of the display panel along the line AB as shown in FIG. 2A, viewed from a rightward direction illustrated by the rightward arrows.

As shown in FIG. 2A and FIG. 2B, the display panel includes a substrate 100 and a circuit structure 200. The substrate 100 includes a first bonding area 110 (as illustrated by the unfilled box with dotted lines on the substrate 100 that is encircled by the oval in FIG. 2A), and the circuit structure 200 includes a second bonding area 210 (as illustrated by the unfilled box with dotted lines on the circuit structure 200 in FIG. 2A), which oppositely faces the first bonding area 110 of the substrate 100. The second bonding area 210 on the circuit structure 200 is bonded to the first bonding area 110 of the substrate 100 through a first bonding adhesive 300. That is, the circuit structure 200 is bonded to the substrate 100 through the first bonding adhesive 300 that is applied onto the first bonding area 110 on the substrate 100 and onto the second bonding area 210 on the circuit structure 200.

In the embodiments of the display panel illustrated in FIG. 2A and FIG. 2B, the second bonding area 210 on the circuit structure 200 is provided with at least one first indentation 900, and the first bonding adhesive 300 is configured to fill at least one portion of the at least one first indentation 900 to enhance the bonding strength between the circuit structure 200 and the substrate 100.

When the second bonding area 210 on the circuit structure 200 is bonded to the first bonding area 110 on the substrate 100, the first bonding adhesive 300 flows into each of the at least one first indentation 900 after heating, which can increase the contact area between the first bonding adhesive 300 and the circuit structure 200, in turn increasing the bonding strength between the first bonding adhesive 300 and the circuit structure 200, ultimately ensuring the quality of the display panel.

As shown in FIG. 2B, the first bonding adhesive 300 can completely fill all portion of each of the at least one first indentation 900, such that the bonding strength between the first bonding adhesive 300 and the circuit structure 200 can be further improved.

Herein, each of the at least one first indentation 900 can have a cross-sectional shape of a square, a rectangle, a circle, or an oval, etc., along a plane parallel to the circuit structure 200. There are no limitations herein.

As further shown, the first bonding area 110 on the substrate 100 includes a first bonding and conduction region 111 (as illustrated by the pattern-filled smaller box on the oval-encircled substrate 100 in FIG. 2A). The substrate 100 includes at least one first conductive electrode (i.e. at least one first pin, not shown in the figures), which is arranged within the first bonding and conduction region 111. The second bonding area 210 on circuit structure 200 correspondingly includes a second bonding and conduction region 211 (as illustrated by the pattern-filled smaller box on the circuit structure 200 in FIG. 2A). The circuit substrate 200 includes at least one second conductive electrode (i.e. at least one second pin) 230, as shown in FIG. 2A, which is arranged within the second bonding and conduction region 211. Herein the at least one first conductive electrode on the substrate and/or at least one second conductive electrode are collected termed as electrical components.

In the embodiment of the display panel described herein, it is further configured such that the first bonding adhesive 300 comprises an anisotropic conductive adhesive, which is arranged between the first bonding and conduction region 111 on the substrate 100 and the second bonding and conduction region 211 on the circuit structure 200. As such, the at least one second conductive electrode 230 arranged in the second bonding and conduction region 211 within the second bonding area 210 on the circuit structure 200 can be electrically coupled/connected to the at least one first conductive electrode arranged in the first bonding and conduction region 111 within the first bonding area 110 on the substrate 100 via the anisotropic conductive adhesive.

Each of the at least one first indentation 900 is further configured such that an orthographic projection thereof on the substrate 100 is located outside the first bonding and conduction region 111 on the substrate 100. Because each of the at least one second conductive electrode 230 on the circuit structure 200 is electrically connected to a chip or a circuit board by a wiring 231, as illustrated in FIG. 2A, each of the at least one first indentation 900 is arranged at a position to bypass each of the at least one second conductive electrode 230 and a wiring 231 that correspondingly connects the each of the at least one second conductive electrode 230 in the circuit structure 200.

In the display panel disclosed herein and illustrated in FIG. 2B, an orthographic projection of the first bonding area 110 on the substrate 100 on a first reference plane that is parallel to a main plane of the substrate 100 substantially completely covers an orthographic projection of the at least one first indentation 900 on the first reference plane. In other words, an orthographic projection of the first bonding area 110 of the substrate 100 on the circuit structure 200 completely covers the at least one first indentation 900 on the circuit structure 200.

It is noted that the above embodiment of the display panel illustrated in FIG. 2B shall be interpreted as an illustrating example only, and shall not impose a limitation to the scope of the disclosure. For example, it can be configured such that an orthographic projection of the first bonding area 110 on the substrate 100 on a first reference plane that is parallel to a main plane of the substrate 100 overlaps at least partially with an orthographic projection of the at least one first indentation 900 on the first reference plane. In other words, the orthographic projection of the first bonding area 110 on the substrate 100 on the circuit structure 200 overlaps at least partially with the at least one first indentation 900 on the circuit structure 200.

In the embodiments of the display panel illustrated in FIG. 2B, the first bonding adhesive 300 includes a first anisotropic conductive adhesive, which is arranged in a first space between the first bonding and conduction region 111 on the substrate 100 and the second bonding and conduction region 211 on the circuit structure 200, and is configured to electrically connect the at least one first conductive electrode on the substrate 100 and the at least one second conductive electrode 230 on the circuit structure 200.

The first bonding adhesive 300 can further include at least one other adhesive, arranged at regions between the first bonding area 110 on the substrate 100 and the second bonding area 210 on the circuit structure 200 other than the first space between the first bonding and conduction region 111 and the second bonding and conduction region 211. The at least one other adhesive is configured to enhance the bonding strength between the substrate 100 and the circuit structure 200.

In the embodiment of the display panel illustrated in FIG. 2B, the at least one other adhesive includes a second anisotropic conductive adhesive, which preferably can have a substantially same composition as the first anisotropic conductive adhesive. As such, a same bonding adhesive (i.e. a same anisotropic conductive adhesive) can be employed for the bonding between the whole first bonding area 110 on the substrate 100 and the second bonding area 210 on the circuit structure 200, thereby resulting in a reduced manufacturing process. Yet the second anisotropic conductive adhesive can optionally have a different composition from the first anisotropic conductive adhesive.

It is further noted that the at least one other adhesive can optionally comprise a bonding adhesive other than an anisotropic conductive adhesive, for example, a non-conductive thermosetting adhesive, which will be described below in the embodiment illustrated in FIG. 2F in detail.

In the embodiment of the display panel illustrated in FIG. 2B, the first bonding area 110 on the substrate 100 and the second bonding area 210 on the circuit structure 200 have substantially same area. In other words, an orthographic projection of the first bonding area 110 of the substrate 100 on the circuit structure 200 substantially matches with an orthographic projection of the second bonding area 210 of the circuit structure 200.

In the embodiment of the display panel such as the one shown in FIG. 2B, the first bonding adhesive 300 can thus include, in addition to the first anisotropic conductive adhesive arranged in the first space between the first bonding and conduction region 111 on the substrate 100 and the second bonding and conduction region 211 on the circuit structure 200, a second anisotropic conductive adhesive or a non-conductive thermosetting adhesive arranged in spaces other than the first space between the first bonding area 110 of the substrate 100 and the second bonding area 210 of the circuit structure 200.

It is noted that the embodiment shown in FIG. 2B is only one illustrating example, and according to some other embodiments of the display panel, the second bonding area 210 of the circuit structure 200 can have a larger area than the first bonding area 110 on the substrate 100, and the at least one adhesive other than the first bonding adhesive 300 can cover a side surface of the substrate 100 and a portion within the second bonding area 210 of the circuit structure 200. Herein the portion can be a portion of the second bonding area 210 which is substantially a difference between the second bonding area 210 and an orthographic projection of the first bonding area 110 of the substrate 100 on the circuit structure 200, and the adhesive can be termed a side adhesive.

Figure 2C:
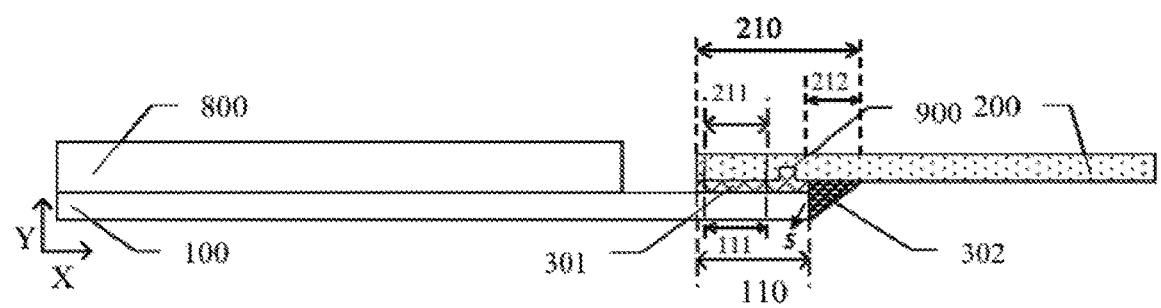
FIG. 2C is a cross-sectional view illustrating a display panel according to another embodiment of the disclosure.

FIG. 2C illustrates one such an embodiment of the display panel. As shown in FIG. 2C, the first bonding adhesive 300 includes a first anisotropic conductive adhesive 301 and a first side adhesive 302. The first side adhesive 302 is configured to cover both a side surface (i.e. indicated as S in FIG. 2C) of the substrate 100 and a portion within the second bonding area 210 (i.e. indicated as 212 in FIG. 2C) of the circuit structure 200 facing the substrate 100 and close to the side surface S of the substrate 100. Herein, the portion 212 is substantially a sub-area in the second bonding area 210 that excludes an orthographic projection of the first bonding area 110 of the substrate 100 on the circuit structure 200. The first anisotropic conductive adhesive 301 is arranged in other space between the first bonding area 110 and the second bonding area 210, and is configured to electrically connect the electrical components on the substrate and on the circuit structures.

In other words, in the embodiment of the display panel illustrated in FIG. 2C, the first side adhesive 302 is arranged substantially between the side surface S of the substrate 100 and the portion 212 of the circuit structure 200. The first side adhesive 302 can enhance the bonding strength between the circuit structure 200 and the substrate 100.

In the embodiment of the display panel illustrated in FIG. 2C, the display panel further comprises a cover glass 800 over a same surface (i.e. the upper surface of the substrate 100 as illustrated in FIG. 2C) of the substrate 100 as the circuit structure 200. The at least one first indentation 900 is arranged such that an orthographic projection thereof on the substrate 100 is over a side of the first bonding and conduction region 111 that is far away from an orthographic projection of the cover glass 800 on the substrate 100 along a direction of the X-axis. In other words, the orthographic projection of the at least one first indentation 900 on the substrate 100 and the orthographic projection of the cover glass 800 on the substrate 100 are respectively over the two sides of the first bonding and conduction region 111 on the substrate 100.

It is noted that there is no limitation to which side of the first bonding and conduction region 111 the at least one first indentation 900 can be arranged over along the direction of the X-axis. For example, the at least one first indentation 900 can optionally be arranged such that an orthographic projection thereof on the substrate 100 is over a side of the first bonding and conduction region 111 that is proximal to the cover glass 800 along the direction of the X-axis.

In any of the embodiments of the display panel illustrated in FIG. 2B or FIG. 2C, each of the at least one first indentation 900 substantially has a shape of a groove (i.e. a type of an indentation that has a bottom surface and does not run through the circuit structure 200).

Yet it is noted that this is only one optional, and according to some other embodiments, each of the at least one first indentation 900 can have a shape of a through-hole. For example, in another embodiment of the display panel whose cross-sectional view is illustrated in FIG. 2D or FIG. 2E, each of the at least one first indentation 900 comprises a through-hole 901, and the first bonding adhesive 300 can fill at least a portion of the through-hole 901.

It is further noted that in the display panel disclosed herein, a number of the at least one first indentation 900 can be more than one, and each of the at least one first indentation 900 can have a shape of a groove or have a shape of a through-hole. As such, in the display panel disclosed herein, all of the first indentations 210 have a shape of grooves according to some embodiments; or alternatively, all of the first indentations 210 have a shape of through-holes according to some other embodiments; or alternatively, some of the first indentations 210 have a shape of grooves whereas others of the first indentations 210 have a shape of through-holes according to yet some other embodiments.

Figure 2D:
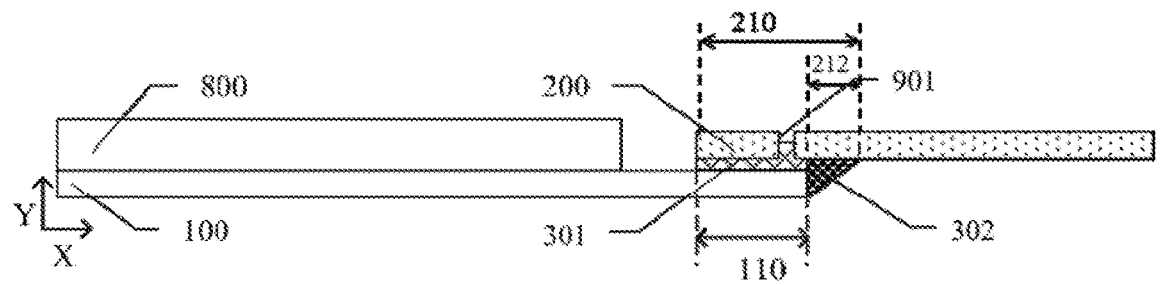
FIG. 2D is a cross-sectional view illustrating a display panel according to yet another embodiment of the disclosure.

In embodiments of the display panel where any of the at least one first indentation 900 comprises a through-hole 901, such as in the embodiment shown in FIG. 2D, the first bonding adhesive 300 can completely fill the through-hole 901 to thereby further enhance the bonding strength of the first bonding area 110. Yet when the first bonding adhesive 300 fills the through-hole 901, there may be a problem of adhesive overflow (i.e. overflow of the first bonding adhesive 300).

Figure 2E:
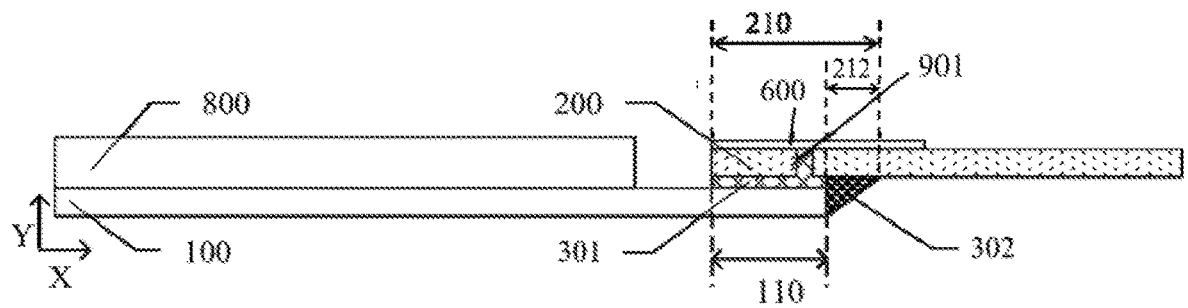
FIG. 2E is a cross-sectional view illustrating a display panel according to yet another embodiment of the disclosure.

In order to avoid the problem of adhesive overflow mentioned above, according to some embodiments illustrated in FIG. 2E, the display panel further includes a first reinforcement plate 600, which is arranged on a surface of the circuit structure 200 that is far from the substrate 100 along a direction perpendicular to the substrate 100 (i.e. a direction of Y-axis illustrated in FIG. 2E), and the first reinforcement plate 600 is configured to completely cover the through-hole 901 to thereby prevent the first bonding adhesive 300 from overflowing on a surface (i.e. the upper surface of the circuit structure 200 illustrated in FIG. 2E) of the circuit structure 200 that is far away from the substrate 100. The first reinforcing plate 600 can be glued or bonded to the above mentioned surface of the circuit structure 200 via an adhesive.

It is noted that in embodiments of the display panel where the circuit structure 200 is a flexible printed circuit board (PCB), the first reinforcing plate 600 can also play a role of smoothening the flexible printed circuit board and relieving stress, so as to increase the structural strength of the first bonding area 110 and further to reduce the probability of damage at the first bonding area 110 under external forces.

Figure 2F:
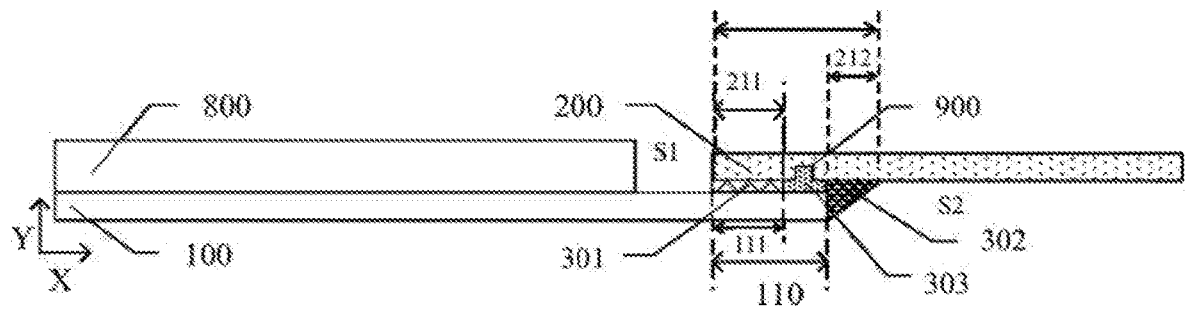
FIG. 2F is a cross-sectional view illustrating a display panel according to yet another embodiment of the disclosure.

In an embodiment of the display panel whose cross-sectional view is illustrated in FIG. 2F, the first bonding adhesive 300 can include, in addition to a first anisotropic conductive adhesive 301 and the first adhesive 302, another adhesive 303. As illustrated in FIG. 2F, the first anisotropic conductive adhesive 301 is arranged in a first space S1 (indicated by the box with dotted lines in FIG. 2F) between the first bonding and conduction region 111 and the second bonding and conduction region 211. The first side adhesive 302 is arranged in a second space S2 (indicated by the oval with dotted lines in FIG. 2F) between the side surface S of the substrate 100 and the portion 212 of the circuit structure 200. The another adhesive 303 is arranged in a third space (not shown in the figure) between the first bonding area 110 of the substrate 100 and the second bonding area 210 of the circuit structure 200 other than the first space S1 and the second space S2.

Herein, the another adhesive 303 can have a composition of an anisotropic conductive adhesive (e.g. the first anisotropic conductive adhesive, or a different anisotropic conductive adhesive), or of a side adhesive (e.g. the first side adhesive 302, or a different side adhesive), or alternatively of a non-conductive thermosetting adhesive.

Herein the non-conductive thermosetting adhesive is referred to as an adhesive that is thermosetting but not conductive. The non-conductive thermosetting adhesive, if used as the another adhesive 303 can flow into each of the at least one first indentation 900 after heating to increase the contact area between the first bonding adhesive 300 and the circuit structure 200, thereby increasing the bonding strength between the first bonding adhesive 300 and the circuit structure 200. In some embodiments, The non-conductive thermosetting adhesive can flow into at least one first indentation 900 after heating to increase the contact area between the first bonding adhesive 300 and the circuit structure 200.

In any of the embodiments of the display panel shown in FIGS. 2B-2F, the at least one first indentation 900 on the second bonding area 210 of the circuit structure 200 is arranged to be completely covered by, or at least partially overlapped with, an orthographic projection of the first bonding area 110 of the substrate 100 on the circuit structure 200. It is noted that these represent only one illustrating examples, and other options are possible.

Figure 2G:
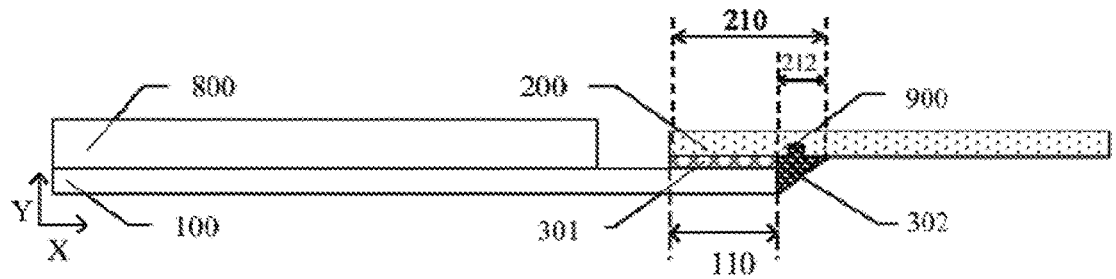
FIG. 2G is a cross-sectional view illustrating a display panel according to yet another embodiment of the disclosure.

FIG. 2G is a cross-sectional view illustrating a display panel according to some embodiment of the disclosure. As shown in FIG. 2G, the orthographic projection of the first bonding area 110 of the substrate 100 on the circuit structure 200 is not overlapped with the at least one first indentation 900 on the circuit structure 200. In other words, the at least one first indentation 900 on the circuit structure 200 is outside the orthographic projection of the first bonding area 110 of the substrate 100 on the circuit structure 200.

Furthermore, in the embodiment of the display panel shown in FIG. 2G, the at least one first indentation 900 is at least partially filled with a first side adhesive 302 that is arranged between the side surface S of the substrate 100 and the portion 212 of the circuit structure 200. As such, the contact area between the first side adhesive 302 and the circuit structure 200 can be increased, thereby the bonding strength between the substrate 100 and the circuit structure 200 can be enhanced.

In the embodiment of the display panel illustrated in FIG. 2G, the first bonding adhesive 300 also comprises a first anisotropic conductive adhesive 301, which is arranged in the space between the first bonding area 110 of the substrate 100 and the second bonding area 210 of the circuit structure 200 so as to electrically connect the electrical components (e.g. the at least one first conductive electrode) on the substrate 100 and the electrical components (e.g. the at least one second conductive electrode 230) on the circuit structure 200.

It is noted that in each of the embodiments of the display panel described above, the at least one indentation is arranged on the circuit structure, or more specifically, on a surface of the circuit structure facing the substrate (i.e. lower surface of the circuit structure, as illustrated in any one of FIGS. 2B-2G). It is noted however that the at least one indentation 900 can optionally be arranged on the substrate 100.

Figure 2H:
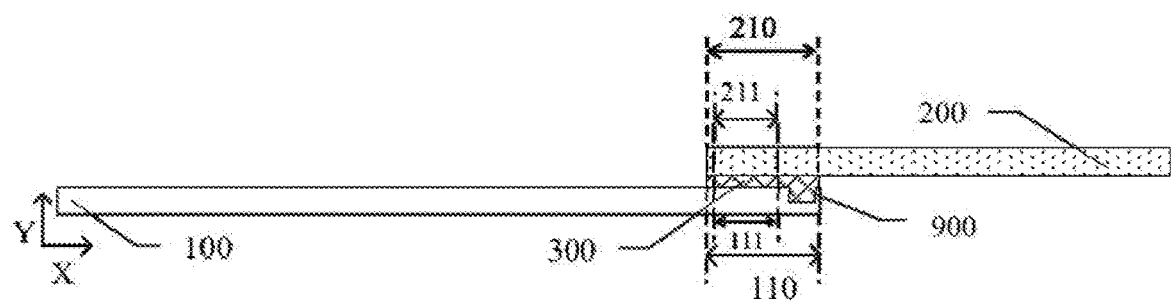
FIG. 2H is a cross-sectional view illustrating a display panel according to yet another embodiment of the disclosure.

FIG. 2H is a cross-sectional view illustrating a display panel according to yet another embodiment of the disclosure. In the embodiment of the display panel shown in FIG. 2H, the at least one first indentation 900 is arranged on the first bonding region 110 (i.e. the upper surface of the substrate 100 in the figure) of the substrate 100 facing the circuit structure 200, and the first bonding adhesive 300 fills at least a portion of the at least one first indentation 900 so as to increase the bonding strength between the substrate 100 and the circuit structure 200.

In the embodiment of the display panel described herein, the at least one first indentation 900 is arranged only on the substrate 100, which can have substantially similar or same feature(s) as the embodiments of the display panel described above and illustrated in FIGS. 2A-2F. Yet it is noted that for the embodiment illustrated in FIG. 2H, or the embodiments where any of the at least one first indentation 900 is arranged on the substrate 100, the at least one first indentation 900 on the substrate 100 can only be arranged such that an orthographic projection thereof on a common reference plane parallel to the substrate 100 at least partially overlaps with an orthographic projection of the circuit structure 200 on the common reference plane. In other words, the first bonding adhesive 300 cannot be a first side adhesive, such as in the embodiment shown in FIG. 2G. In addition, the at least one first indentation 900 on the substrate 100 can only have a shape of a groove but not have a shape of a through-hole.

Figure 2I:
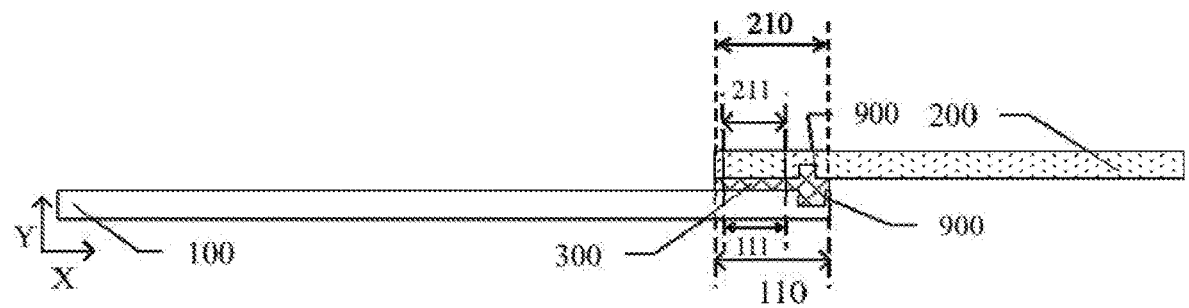
FIG. 2I is a cross-sectional view illustrating a display panel according to yet another embodiment of the disclosure.

It is further noted that the at least one first indentation 900 can optionally be arranged on both the substrate 100 and on the circuit structure 200. FIG. 2I is a cross-sectional view illustrating a display panel according to an embodiment of the disclosure. In the embodiment of the display panel shown in FIG. 2I, each of the first bonding area 110 of the substrate 100 and the second bonding area 210 of the circuit structure 200 is provided with at least one first indentation 900, and the first bonding adhesive 300 can fill both at least one portion of the at least one first indentation 900 on the circuit structure 200 and at least one portion of the at least one first indentation 900 on the substrate 100 such that the bonding strength between the substrate 100 and the circuit structure 200 can be further enhanced.

In any one of the embodiments of the display panel described above, the circuit structure 200 can comprise a flexible printed circuit board. There are no limitations herein.

Figure 3:
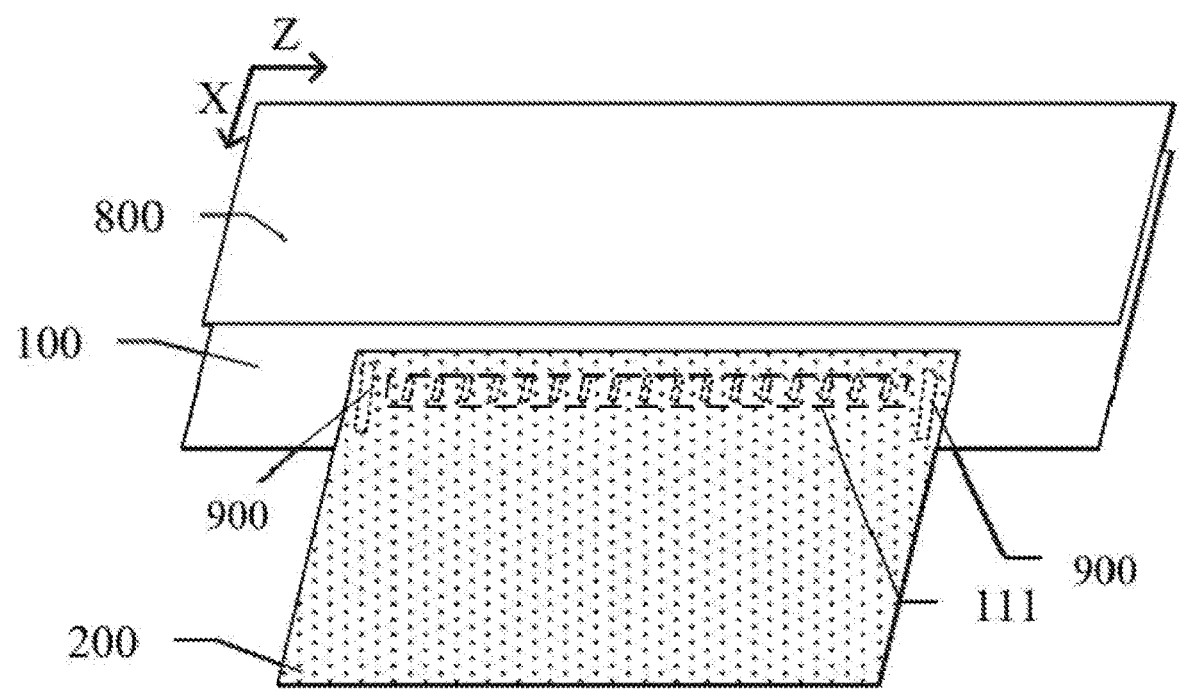
FIG. 3 shows a perspective view of a display panel according to yet another embodiment of the disclosure.

FIG. 3 is a cross-sectional view illustrating a display panel according to yet another embodiment of the disclosure. In the embodiment shown in FIG. 3, two first indentations 900 are respectively arranged over both sides of the first bonding and conduction region 111 along a direction of the Z-axis on the circuit structure 200. Such an arrangement not only increases a bonding strength for the first bonding area, but also allows the first indentation(s) 210 to bypass the conductive electrodes and wirings on the circuit structure 200. It is noted that the arrangement of the first indentations 900 over both sides of the first bonding and conduction region 111 along a direction of the Z-axis on the circuit structure 200 represents only one illustrating example, and optionally, the first indentations 900 can be arranged over only one side of the first bonding and conduction region 111 along a direction of the Z-axis on the circuit structure 200.

According to some embodiments of the disclosure, the display panel can further include a circuit board in addition to a substrate and a circuit structure, and herein the circuit structure can have a structure of chip on film (COF). The structure and configuration for bonding the substrate and the circuit structure can take an embodiment according to any one of the embodiments described above and illustrated in FIGS. 2A-2I, and the structure and configuration for bonding the circuit board and the circuit structure can take a substantially same structure and configuration as that for bonding the substrate and the circuit structure.

In the following, with reference to FIGS. 4A-4D, 5, and 6, various embodiments of the structure and configuration for bonding the circuit board and the circuit structure will be described in detail.

Figure 4A:
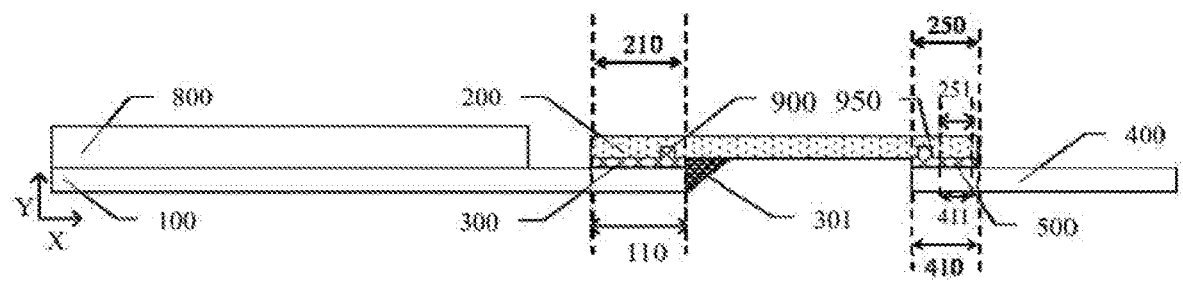
FIG. 4A is a cross-sectional view illustrating a display panel according to yet another embodiment of the disclosure.

FIG. 4A is a cross-sectional view illustrating a display panel according to yet another embodiment of the disclosure. In the embodiment of the display panel shown in FIG. 4A, the display panel includes a substrate 100, a circuit structure 200, and a circuit board 400. The circuit structure 200 comprises a cladding film, and the circuit board 400 can optionally be a flexible circuit board.

As shown in FIG. 4A, a first bonding area 110 on the substrate 100 and a second bonding area 210 on the circuit structure 200 are bonded with each other via a first bonding adhesive 300 arranged therebetween, and the circuit structure 200 is provided with at least one first indentation 900, arranged within the second bonding area 210 of the circuit structure 200, that is filled with the first bonding adhesive 300 to thereby enhance the bonding strength between the substrate 100 and the circuit structure 200. A cover glass 800 is arranged over a same surface (i.e. the upper surface of the substrate 100) of the substrate 100 as the circuit structure 200.

The circuit board 400 includes a third bonding area 410, and the circuit structure 200 further includes a fourth bonding area 250, which is at an end portion of the circuit structure 200 that is opposite to the second bonding area 210 that is bonded with the first bonding area 110 on the substrate 100.

The circuit board 400 is bonded with the circuit structure 200 via a second bonding adhesive 500 arranged between the third bonding area 410 on the circuit board 400 and the fourth bonding area 250 on the circuit structure 200.

As further shown in FIG. 4A, the fourth bonding area 250 of the circuit structure 200 is provided with at least one second indentation 950, and the second bonding adhesive 500 fills at least one portion of the at least one second indentation 950.

In the embodiment of the display panel described herein, when bonding the fourth bonding area 250 of the circuit structure 200 to the third bonding area 410 of the circuit board 400, the second bonding adhesive 500 can, after heating, flow into the at least one second indentation 950, such that the contact area between the second bonding adhesive 500 and the circuit structure 200 can be increased, which in turn enhance the bonding strength between the circuit structure 200 and the circuit board 400, thereby ensuring a quality of the display panel.

It shall be noted that although the embodiment of the display panel illustrated in FIG. 4A adopts a substantially same configuration for the bonding between the circuit structure 200 and the substrate 100 as the embodiment of the display panel illustrated in FIG. 2C, the bonding is not limited herein, and can optionally adopt any of the other embodiments shown in FIGS. 2B and 2D-2I.

It is further noted that for each of the at least one second indentation 950, the shape thereof and the relative positional relationship between each of the at least one second indentation 950 and the fourth bonding area 250 can be substantially same as, or different from, the shape of each of the at least one first indentation 900 and the relative positional relationship between each of the at least one first indentation 900 and the second bonding area 210. There are no limitations herein.

In the embodiment of the display panel illustrated in FIG. 4A, the third bonding area 410 on the circuit board 400 includes a third bonding and conduction region 411. The circuit board 400 includes at least one third conductive electrode (i.e. at least one third pin), which is arranged in the third bonding and conduction region 411. The fourth bonding area 250 on the circuit structure 200 correspondingly includes a fourth bonding and conduction region 251, and at least one fourth conductive electrode on the circuit structure 200 is arranged in the fourth bonding and conduction region 251.

Figure 4B:
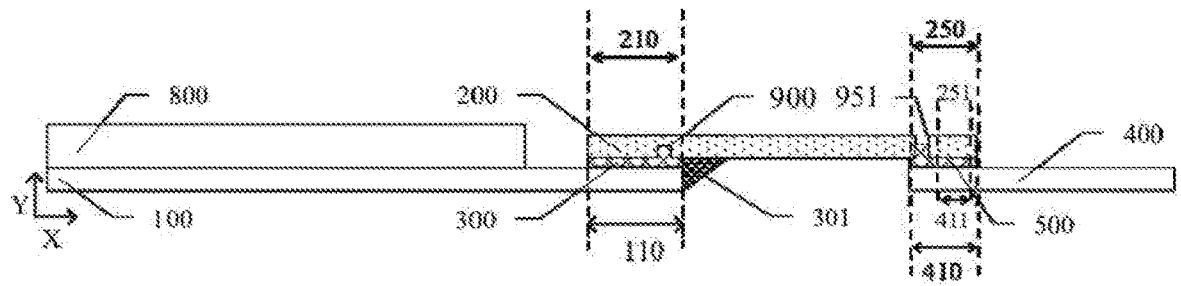
FIG. 4B is a cross-sectional view illustrating a display panel according to yet another embodiment of the disclosure.
Figure 4C:
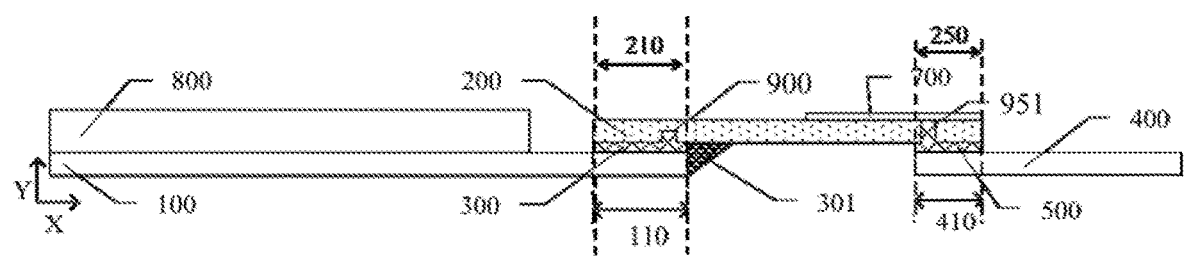
FIG. 4C is a cross-sectional view illustrating a display panel according to yet another embodiment of the disclosure.
Figure 4D:
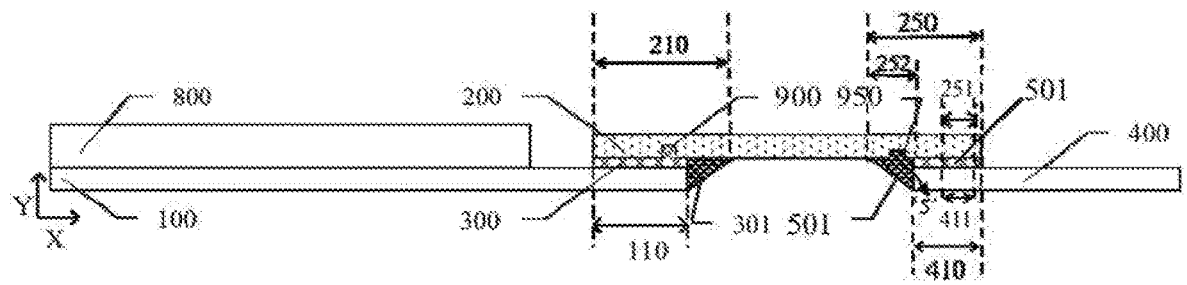
FIG. 4D is a cross-sectional view illustrating a display panel according to yet another embodiment of the disclosure.

In order to electrically connect with the at least one third conductive electrode on the circuit board 400 and the at least one fourth conductive electrode on the circuit structure 200, the second bonding adhesive 500 can include a third anisotropic conductive adhesive (e.g. such as the third anisotropic conductive adhesive 501 in FIG. 4D), which is arranged between the third bonding and conduction region 411 on the circuit board 400 and the fourth bonding and conduction region 251 on the circuit structure 200. Herein the third anisotropic conductive adhesive can have a substantially same composition as the first anisotropic conductive adhesive as described above, but can also be a different anisotropic conductive adhesive.

Herein, the at least one second indentation 950 is arranged outside the fourth bonding and conduction region 251 in the fourth bonding area 250 on the circuit structure 200, and each of the at least one second indentation 950 is further arranged at a position such that it bypasses the at least one fourth conductive electrode and the at least one wiring on the circuit structure 200.

In this embodiment of the display panel illustrated in FIG. 4A, the substrate 100 and the circuit board 400 are arranged over a same side (i.e. a lower side) of the circuit structure 200, and thereby the circuit structure 200 can substantially be a structure with chips, electrodes, and wirings arranged on only one side thereof (i.e. the lower side surface).

It is noted that this shall not be interpreted as a limitation to the scope of the disclosure. According to some other embodiments of the display panel, the substrate and the circuit board can be optionally arranged on two opposing sides of the circuit structure respectively. Thereby, in these embodiments of the display panel, the circuit structure can substantially be a structure where chips, electrodes, and wirings are arranged on both sides thereof.

According to some embodiments of the display panel, the second bonding adhesive 500 further includes a second side adhesive, such as the second side adhesive 502 in the one embodiment of the display panel illustrated in FIG. 4D, which covers a side surface of the circuit board 400 and a portion of the circuit structure 200 so as to further enhance the bonding strength between the circuit board 400 and he circuit structure 200. The second side adhesive 502 is substantially similar to the first side adhesive 302 described in the embodiments of the display panel shown in FIG. 2C-2G.

With further reference to FIG. 4A, the second bonding adhesive 500 includes a third anisotropic conductive adhesive (which can be substantially same as or different from the first anisotropic conductive adhesive 301 described above and illustrated in FIG. 2F) arranged in a space between the third bonding and conduction region 411 on the circuit board 400 and the fourth bonding and conduction region 251 on the circuit structure 200.

The second bonding adhesive 500 further includes a fourth anisotropic conductive adhesive (which can be substantially same as or different from the third anisotropic conductive adhesive described above) or a second non-conductive thermosetting adhesive, arranged in spaces between the third bonding area 410 on the circuit board 400 and the fourth bonding area 250 on the circuit structure 200 other than the space between the third bonding and conduction region 411 and the fourth bonding and conduction region 251 to fill the at least one second indentation 950 to thereby increase the bonding strength between the circuit structure 200 and the circuit board 400. There are no limitations herein.

In the display panel, a number of the at least one second indentation 950 can be one, or more than one according to different embodiments of the disclosure.

In the display panel, each of the at least one second indentation 950 can have a shape of a groove, as illustrated in the embodiment shown in FIG. 4A, or a through-hole 951, as illustrated in in another embodiment shown in FIG. 4B.

In embodiments of the display panel where there are more than one second indentation 950, the more than one second indentation 950 can each have a shape of a groove, or alternatively can each have a shape of a through-hole, or alternatively can have a shape of a groove for some and have a shape of a through-hole for others. There are no limitations herein.

With a bonding structure similar to the embodiment of the display panel shown in FIG. 2E, according to some embodiments of the display panel, such as the one illustrated in FIG. 4C, the display panel further includes a second reinforcing plate 700, which is arranged on a surface of the circuit structure 200 that is far away from the circuit board 400 along a direction perpendicular to the substrate 100 (i.e. a direction of Y-axis illustrated in FIG. 4C), and the second reinforcement plate 700 is configured to completely cover the through-hole 951 to thereby prevent the second bonding adhesive 300 from overflowing on a surface (i.e. the upper surface of the circuit structure 200 illustrated in FIG. 2E) of the circuit structure 200 that is far away from the circuit board 400. The second reinforcing plate 700 can be glued or bonded to the above mentioned surface of the circuit structure 200 via an adhesive.

With a bonding structure similar to the embodiment of the display panel shown in FIG. 2G, according to some embodiments of the display panel, such as the one illustrated in FIG. 4D, the orthographic projection of the third bonding area 410 of the circuit board 400 on the circuit structure 200 is not overlapped with the at least one second indentation 950 on the circuit structure 200. In other words, the at least one second indentation 950 on the circuit structure 200 is outside the orthographic projection of the third bonding area 410 of the circuit board 400 on the circuit structure 200.

Furthermore, in the embodiment of the display panel shown in FIG. 4D, the at least one second indentation 950 is at least partially filled with a second side adhesive 502 that is arranged between the side surface S' of the circuit board 400 and the portion 252 within the fourth bonding area 250 of the circuit structure 200. As such, the contact area between the second side adhesive 502 and the circuit structure 200 can be increased, thereby the bonding strength between the circuit board 400 and the circuit structure 200 can be enhanced.

Figure 4E:
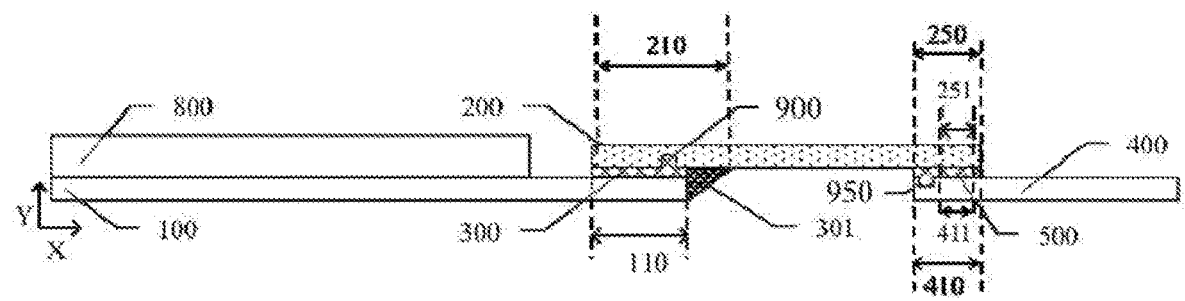
FIG. 4E is a cross-sectional view illustrating a display panel according to yet another embodiment of the disclosure.

FIG. 4E is a cross-sectional view of a display panel according to some embodiments of the disclosure. Differing from the embodiment of the display panel shown in FIG. 4A, the at least one second indentation 950 is arranged on the third bonding area 410 of the circuit board 400. The second bonding adhesive 500 fills at least a portion of the at least one second indentation 950 after heating, which can increase the contact area between the second bonding adhesive 500 and the circuit board 400, in turn enhancing the bonding strength between the circuit structure 200 and the circuit board 400, thereby ensuring a quality of the display panel. Herein, the at least one second indentation 950 is further configured to bypass or avoid chips, electrodes or wirings on the circuit board 400.

With a bonding structure similar to the embodiment of the display panel shown in FIG. 2H, in the embodiment of the display panel illustrated in FIG. 4E, the at least one second indentation 950 is arranged only on the circuit board 400, which can have substantially similar or same feature(s) as the embodiments of the display panel described above and illustrated in FIGS. 4A-4C.

Yet it is noted that for the embodiment illustrated in FIG. 4E, or the embodiments where the at least one second indentation 950 is arranged on the circuit board 400, the at least one second indentation 950 on the circuit board 400 can only be arranged such that an orthographic projection thereof on a common reference plane parallel to the circuit board 400 at least partially overlaps with an orthographic projection of the circuit structure 200. In other words, the second bonding adhesive 500 for filing the at least one second indentation 950 in this embodiment of the display panel cannot be a second side adhesive, such as in the embodiment shown in FIG. 4D. In addition, the at least one second indentation 950 on the substrate 100 can only have a shape of a groove but not have a shape of a through-hole.

Figure 4F:
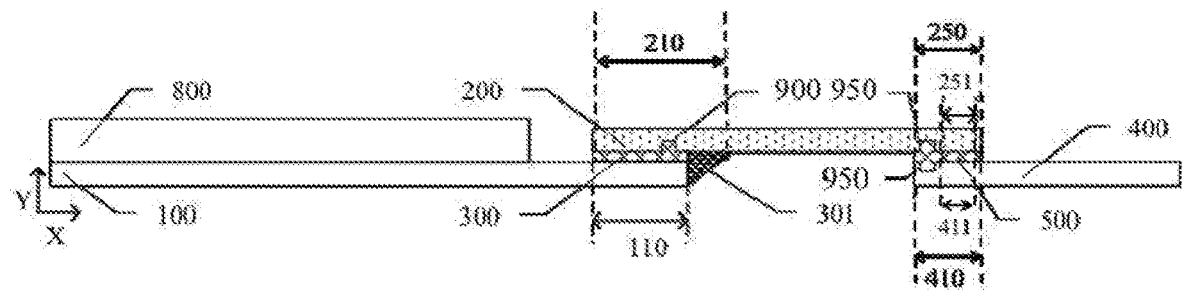
FIG. 4F is a cross-sectional view illustrating a display panel according to yet another embodiment of the disclosure.

With a bonding structure similar to the embodiment of the display panel shown in FIG. 2I, according to some embodiments of the display panel, such as the one illustrated in FIG. 4F, each of the third bonding area 410 of the circuit board 400 and the fourth bonding area 250 of the circuit structure 200 is provided with at least one second indentation 950, and the second bonding adhesive 500 can fill both at least one portion of the at least one second indentation 950 on the circuit structure 200 and at least one portion of the at least one second indentation 950 on the circuit board 400 so as to enhance the bonding strength between the circuit board 400 and the circuit structure 200.

In a second aspect, the present disclosure further provides a method for manufacturing a display panel. The display panel can be any one of the embodiments of the display panel described above.

Figure 5:
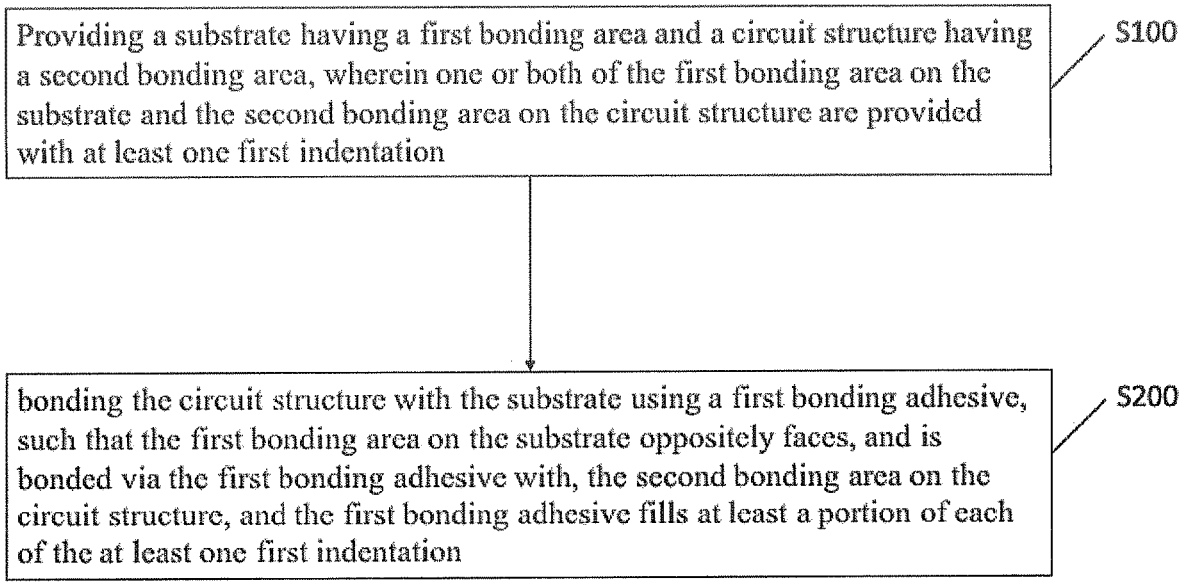
FIG. 5 illustrates a flow chart of a method for manufacturing a display panel according to some embodiments of the disclosure.

FIG. 5 illustrates a flow chart of the manufacturing method according to some embodiments of the disclosure. As shown in FIG. 5, the manufacturing method comprises the following steps:

S100: providing a substrate having a first bonding area and a circuit structure having a second bonding area, wherein one or both of the first bonding area on the substrate and the second bonding area on the circuit structure are provided with at least one first indentation;

S200: bonding the circuit structure with the substrate using a first bonding adhesive, such that the first bonding area on the substrate oppositely faces, and is bonded via the first bonding adhesive with, the second bonding area on the circuit structure, and the first bonding adhesive fills at least a portion of each of the at least one first indentation.

In the method for manufacturing a display panel disclosed herein, by filling the first bonding adhesive in at least a portion of each of the at least one first indentation, the bonding strength between the circuit structure and the substrate can be increased, in turn ensuring a quality of the display panel manufactured thereby.

According to some embodiments of the method, the at least one first indentation is arranged in the second bonding area on the circuit structure.

According to some other embodiments of the method, the at least one first indentation is arranged in the first bonding area on the substrate. Yet according to some other embodiments of the method, a number of the at least one first indentation is more than one, and the at least one first indentation is arranged in both the first bonding area on the substrate and the second bonding area on the circuit structure.

According to some embodiments, the first bonding area on the substrate comprises a first bonding and conduction region, and at least one first electrode (i.e. at least one first pin) is arranged within the first bonding and conduction region. The second bonding area on the circuit structure comprises a second bonding and conduction region, and at least one second electrode (i.e. at least one second pin) is arranged within the second bonding and conduction region. The first bonding adhesive comprise a first anisotropic conductive adhesive, arranged between, and configured to bond, the first bonding and conduction region of the substrate and the second bonding and conduction region of the circuit structure. Through the first anisotropic conductive adhesive, the at least one second electrode in the second bonding and conduction region of the circuit structure is electrically connected with the at least one first electrode in the first bonding and conduction region of the substrate.

Herein, each of the at least one first indentation can have a shape of a square, a rectangle, a circle, or an oval, etc. along a plane parallel to the substrate or to the circuit structure. There are no limitations herein.

Each of the at least one first indentation can be a groove or a through-hole. In embodiments where any of the at least one first indentation is a through-hole, a first reinforcement plate is optionally configured to completely cover the through-hole to thereby prevent the first bonding adhesive from overflowing on a surface of the circuit structure that is far away from the substrate. The first reinforcing plate can be glued or bonded to the above mentioned surface of the circuit structure via an adhesive.

According to some embodiments, the first bonding adhesive includes a first side adhesive, arranged substantially between a side surface of the substrate and a portion of the second bonding area of the circuit structure. The first side adhesive can enhance the bonding strength between the substrate and the circuit structure.

According to some embodiments, the display panel can further include a circuit board in addition to a substrate and a circuit structure, and herein the circuit structure can be a cladding film. The structure and configuration for bonding the substrate and the circuit structure can take an embodiment according to any one of the embodiments described above, and the structure and configuration for bonding the circuit board and the circuit structure can take a substantially same structure and configuration as that for bonding the substrate and the circuit structure.

In a third aspect, the present disclosure further provides a display apparatus, which includes a display panel according to any one of the embodiments of the display panel described above.

In the display apparatus disclosed herein, because the display panel has the above mentioned structure and configuration for bonding the substrate and the circuit structure, and/or has the above mentioned structure and configuration for bonding the circuit board and the circuit structure, the display apparatus has an enhanced bonding strength between the substrate and the circuit structure, and/or has an enhanced bonding strength between the circuit board and the circuit structure.

As such, the probability of damage on the bonding area of the substrate, of the circuit structure, and/or of the circuit board caused by external forces can be effectively reduced, thereby ensuring a quality of the display apparatus.

Herein the display apparatus can be a liquid crystal display apparatus (LCD) or an organic light-emitting diode (OLED) display apparatus. The display apparatus can be an electronics product such as a television, a digital camera, a mobile phone, a watch, a tablet, a laptop, a GPS, etc., or can be an electronics component that has a display functionality.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation to encompass such modifications and equivalent structures.

The invention claimed is:

1. A display panel, comprising:
   a substrate having a first bonding area;
   a circuit structure having a second bonding area facing the first bonding area; and
   a first bonding adhesive between and contacting the first bonding area and the second bonding area;
   wherein:
      at least one of the first bonding area or the second bonding area comprises at least one first indentation;
      the first bonding adhesive at least partially fills one or more of the at least one first indentation;
      the second bonding area has a larger area than the first bonding area, wherein the first bonding adhesive comprises a first side adhesive, arranged to cover a side surface of the substrate and a portion of the second bonding area of the circuit structure;
      one or more of the at least one first indentation is outside an orthographic projection of the first bonding area on the second bonding area on the circuit structure; and
      the first side adhesive at least partially fills the one or more of the at least one first indentation.

2. The display panel of claim 1, wherein the at least one first indentation is within the first bonding area on the circuit structure.

3. The display panel of claim 2, wherein each of the at least one first indentation has a shape of a groove or a through-hole.

4. The display panel of claim 2, wherein the first bonding adhesive consists of a first anisotropic conductive adhesive, configured to at least partially fill one or more of the at least one first indentation.

5. The display panel of claim 2, wherein the first bonding area comprises a first bonding and conduction region, and the second bonding area comprises a second bonding and conduction region, opposingly facing the first bonding and conduction region, wherein the first bonding adhesive comprises:
   a first anisotropic conductive adhesive, arranged in a space between the first bonding and conduction region and the second bonding and conduction region and configured to electrically connect electrical components in the first bonding and conduction region in the substrate and electrical components in the second bonding and conduction region in the circuit structure; and
   another adhesive, arranged in another space between the first bonding area and the second bonding area other than the space between the first bonding and conduction region and the second bonding and conduction region;

wherein:
   at least one of the first bonding adhesive or the another adhesive at least partially fills the at least one first indentation.

6. The display panel of claim 3, wherein one or more of the at least one first indentation are each a through-hole, wherein:
   the display panel further comprises a first reinforcement plate on a surface of the circuit structure away from the substrate, configured to cover the through-hole to thereby prevent the first bonding adhesive from overflowing.

7. The display panel of claim 1, wherein one or more of the at least one first indentation is within the second bonding area on the substrate.

8. The display panel of claim 1, wherein the at least one first indentation is both within the first bonding area on the circuit structure and within the second bonding area on the substrate.

9. A display apparatus, comprising the display panel according to claim 1.

10. A display panel, comprising:
    a substrate having a first bonding area;
    a circuit structure having a second bonding area facing the first bonding area; and
    a first bonding adhesive between and contacting the first bonding area and the second bonding area;
    wherein:
       at least one of the first bonding area or the second bonding area comprises at least one first indentation;
       the first bonding adhesive at least partially fills one or more of the at least one first indentation;
    the display panel of further comprising:
    a circuit board having a third bonding area; and
    a second bonding adhesive;
    wherein:
       the circuit structure further comprises a fourth bonding area oppositely facing the third bonding area;
       the second bonding adhesive is between and contact the third bonding area and the fourth bonding area; and
       at least one of the third bonding area or the fourth bonding area is provided with at least one second indentation, wherein the second bonding adhesive at least partially fills one or more of the at least one second indentation.

11. The display panel of claim 10, wherein the at least one second indentation is within the fourth bonding area on the circuit structure.

12. The display panel of claim 10, wherein the second bonding adhesive consists of a second anisotropic conductive adhesive, configured to at least partially fill one or more of the at least one second indentation.

13. The display panel of claim 10, wherein each of the at least one second indentation is a groove or a through-hole.

14. The display panel of claim 13, wherein one or more of the at least one second indentation are each a through-hole in the circuit structure, wherein:
    the display panel further comprises a second reinforcement plate on a surface of the circuit structure far away from the circuit board, configured to cover the through-hole to thereby prevent the second bonding adhesive from overflowing.

15. The display panel of claim 10, wherein one or more of the at least one second indentation is within the third bonding area on the circuit board.

16. The display panel of claim 10, wherein the at least one second indentation is both within the third bonding area on the circuit board and within the fourth bonding area on the circuit structure.

17. The display panel of claim 10, wherein the fourth bonding area has a larger area than the third bonding area, wherein the second bonding adhesive comprises a second side adhesive, arranged to cover a side surface of the circuit board and a portion of the fourth bonding area of the circuit structure.

18. The display panel of claim 13, wherein:
one or more of the at least one second indentation is outside an orthographic projection of the third bonding area on the fourth bonding area on the circuit structure; and
the second side adhesive at least partially fills the one or more of the at least one second indentation.

\* \* \* \* \*